United States Patent [19]

Albergo et al.

[11] Patent Number: 4,951,098
[45] Date of Patent: Aug. 21, 1990

[54] ELECTRODE STRUCTURE FOR LIGHT EMITTING DIODE ARRAY CHIP

[75] Inventors: Christopher J. Albergo, Penfield; Samuel Reele, Rochester, both of N.Y.

[73] Assignee: Eastman Kodak Company, Rochester, N.Y.

[21] Appl. No.: 287,222

[22] Filed: Dec. 21, 1988

[51] Int. Cl.⁵ .................................... H01L 33/00
[52] U.S. Cl. ........................... 357/17; 357/65; 357/68; 346/107 R
[58] Field of Search ............. 437/8; 357/65, 68, 17; 361/421, 405, 406; 346/107 R

[56] References Cited

U.S. PATENT DOCUMENTS

| | | | |
|---|---|---|---|
| 3,423,822 | 1/1969 | Davidson | 437/8 |
| 4,467,400 | 8/1984 | Stopper | 357/45 |
| 4,605,944 | 8/1986 | Ishii et al. | 357/17 |
| 4,633,280 | 12/1986 | Takasu | 357/65 |
| 4,747,076 | 5/1988 | Mukai | 357/65 |
| 4,779,108 | 10/1988 | Inoue | 346/160 |
| 4,851,862 | 7/1989 | Newman et al. | 346/107 R |
| 4,896,168 | 1/1990 | Newman et al. | 346/107 R |
| 4,899,174 | 2/1990 | Newman et al. | 346/107 R |

FOREIGN PATENT DOCUMENTS 59-152656  8/1984  Japan ......................... 357/65

*Primary Examiner*—Andrew J. James
*Assistant Examiner*—Dang Xuan Hung
*Attorney, Agent, or Firm*—Norman Rushefsky

[57] ABSTRACT

The electrode structure for selectively energizing a particular light emitting diode site of a light emitting diode array chip includes a narrow electrode strip connected at one end to the diode site, a test pad wider than the conductor strip electrically connected to the other end thereof, a bonding pad wider than said electrode strip and spaced from the test pad opposite the diode site and a severable connecting strip narrower than either pad electrically connecting those two pads to each other.

13 Claims, 1 Drawing Sheet

ELECTRODE STRUCTURE FOR LIGHT EMITTING DIODE ARRAY CHIP

FIELD OF THE INVENTION

The invention relates to light emitting diode (LED) array chips for use in LED array printheads and more particularly to such chips in which each light emitting diode is provided with an electrode structure that includes both a test pad and a bonding pade, which are electrically connected to each other by a severable strip narrower than either of the pads.

DESCRIPTION OF THE PRIOR ART

A typical LED array chip of the type to which the present invention relates comprises a plurality of uniformly spaced light sources or light emitting diode sites along the front face of a semiconductor chip. All of such sites are electrically grounded to a common conductive layer on the back face of the chip and each individual diode site is provided, on the front face of the chip, with its own individual electrode structure by which that site is connected to a control chip so that it can be selectively energized.

In an LED array printhead assembly, a plurality of LED array chips are mounted in end-to-end relation to each other on a support member to provide a continuous line of equally spaced diode sites long enough to traverse a standard size piece of paper. A typical LED array printhead of this type for standard DIN A4 paper would be about 216 mm long. The individual diode sites typically might be spaced at about 160 sites per centimeter, with each chip being somewhat less than 10 mm long.

Once the diode array chips are bonded to the support member it is very difficult to remove and replace a defective chip. Accordingly, each chip is preferably tested before being mounted to the support member.

Because of the tiny size and very close spacing of the diode sites, the electrodes on the front face of the chip extend alternately in opposite directions from the successive diode sites and each electrode terminates in an enlarged pad; whereby the pitch of the adjacent pads on either side of the diode sites is approximately twice that of the diode sites themselves. To test the chip, electrical test probes are brought into contact with the pads, with the back conductive face of the chip electrically connected to the test device, whereby the sites can be energized and their light emitting characteristics can be analyzed. However, because the contact probes must be pressed against the pads firmly to ensure good contact during testing and because these same pads are subsequently used to electrically connect the chip to its associated circuitry, this procedure presents the distinct possibility of the pad surfaces being damaged sufficiently to interfere with the success of the subsequent delicate bonding operation.

When the chips are later connected to their control circuitry, either by wire bonding or tape-automated bonding (TAB), if one or more of the bonds is faulty, the resulting damage to the corresponding pad may make it difficult or impossible to repair this defect. In some cases, particularly if wire bonding is employed, the conductor material being bonded to the pad may penetrate through the very thin pad itself and also through the very thin insulating layer between the pad and the underlying semiconductor substrate, thereby causing an electrical short circuit that destroys the effectiveness of the pad to energize the corresponding diode site. Even if the conductor material is cut or pulled free from the pad, the normally insulated gap between the damaged pad and the substrate may be bridged by a metal thread or fragment from the pad or the conductor material, in which case the short circuit may persist.

SUMMARY OF THE INVENTION

In accordance with the present invention, each light emitting diode of a light emitting diode array chip of the type described above is provided with an electrode structure that includes both a test pad and a bonding pad, which are electrically connected to each other by a severable strip narrower than either of the pads. Accordingly, the test procedure cannot damage the bonding pad; the test and bonding regions are clearly defined to facilitate the alignment procedures associated with the testing and bonding operations; and, a faulty bond can be isolated by servering the corresponding severable strip so that a repair can be made by bonding to the test pad rather than to the bonding pad. Additionally, this construction allows for a difference in pitch or spacing between the test pads and the bonding pads, which is a desirable feature in certain applications in which TAB technology is employed to connect the chips to associated control circuitry.

Various means for practicing the invention and other novel features and advantages thereof will be apparent from the following detailed description of illustrative preferred embodiments thereof, reference being made to the accompanying drawings.

DESCRIPTION OF THE ILLUSTRATIVE PREFERRED EMBODIMENTS

Figure 1:
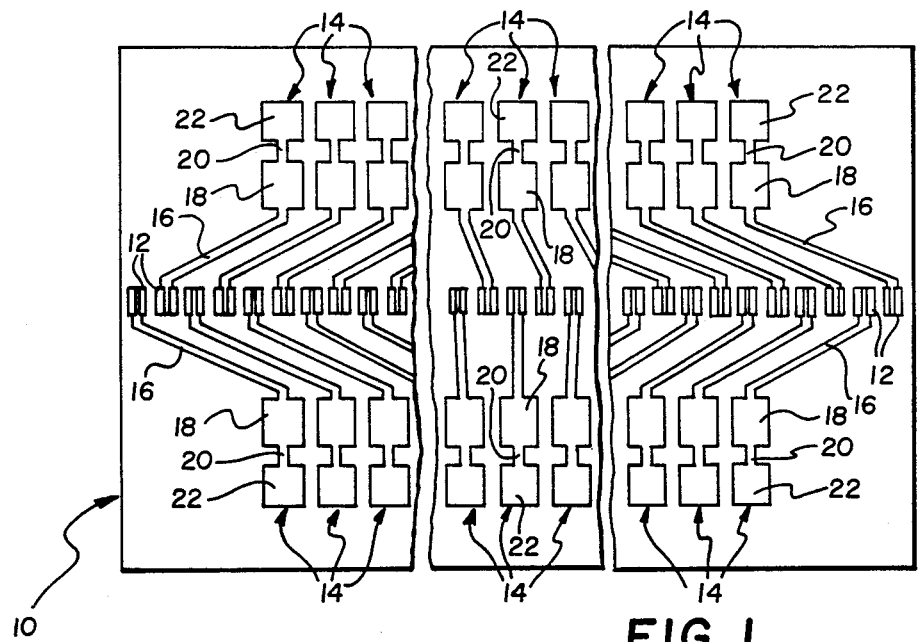
FIG. 1 is a fragmentary plan view of an LED array chip according to a preferred embodiment of the invention.
Figure 2:
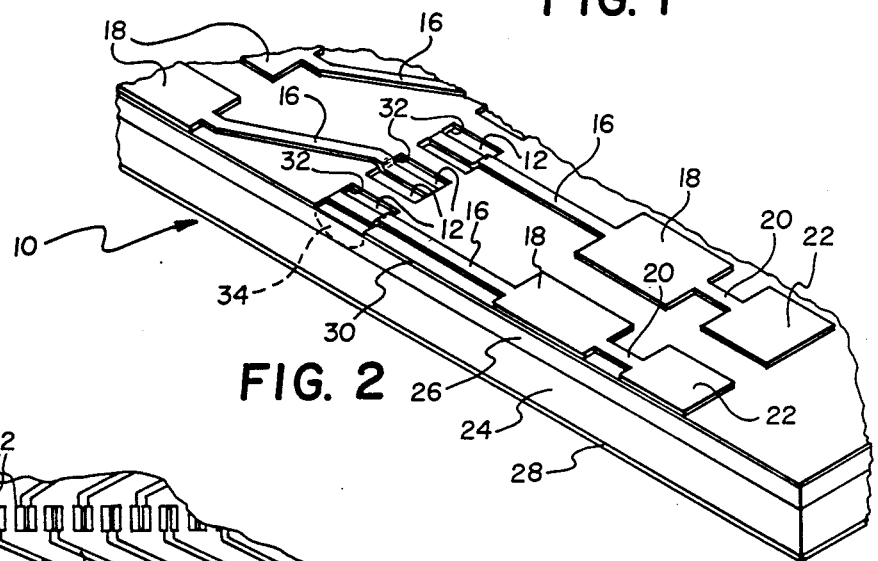
FIG. 2 is a fragmentary perspective view of a portion of the chip shown in FIG. 1.

The illustrative LED diode array chip 10 shown in FIGS. 1 and 2 is of elongate rectangular shape and includes a control row of tiny and closely spaced individual light emitting diodes 12. Each light emitting diode, in turn, is energizable by means of a corresponding electrode structure 14 comprising a narrow electrode strip 16 electrically connecting the diode to a wider test pad 18, which, in turn, is connected by a narrow severable connecting strip 20 to a wider bonding pad 22. To allow the test and bonding pads to be wider than the diodes, the electrode structures extend alternately in opposite directions from the successive diodes. To provide uniform spacing between all of the diodes comprising the printhead, the endmost diodes on each chip must be very near the corresponding ends of the chips, but it is preferable to space the endmost test and bonding pads further from the ends of the chip so that the pressure applied to those pads during testing and bonding operations will not damage the chip. Accordingly, the pitch of the pads is slightly less than twice the pitch of the diodes and the electrode strips 16 are progressively sloped to accommodate this difference in pitch. Stated another way, the electrode strips "fan out" from the pads in both directions from the center portion of the chip to compensate for the fact that the row of diodes is longer than either row of pads.

As shown in FIG. 2, the illustrative diode array chip comprises a substrate 24 made of N type gallium arsenide (GaAs) on which is formed an N type epitaxial layer 26 of gallium arsenide phosphide (GaAsP). A common metallic electrode 28 is formed on the lower surface of substrate 24 and the upper surface of epitaxial layer 26 is provided with a mask layer 30 of silicone nitride, which is provided with windows 32 that define the sites of the individual light emitting diodes 12. After the mask layer 32 has been applied to the epitaxial layer 26, suitable dopants are diffused into the epitaxial layer through windows 32 to define diffused regions, as shown at numeral 34. The boundary between each such region and the surrounding updoped epitaxial layer material provides a PN junction at which light is emitted.

The electrode structures, typically made of aluminum, are formed on the upper surface of the silicone nitride mask and traverse windows 32 in contact with the upper face of the doped epitaxial layer so that each light emitting diode can be energized by current flowing between the corresponding electrode structure 14 and the common electrode 28.

The foregoing description of the construction of the diode chip, per se, is simply illustrative and is typical of technology well known in the art, but the present invention is equally applicable to other types of diode array chips.

Because the regions occupied by the test pads 18 and the bonding pads 22 are clearly delineated according to the invention, those regions can be readily located by a microscope or by other optical means to achieve proper alignment between the chips and the testing or bonding means. Although the pads are shown as being rectangular, they could be of some other shape, e.g. circular; the important consideration being that they be spaced apart from each other and connected by a relatively narrow severable connector strip.

If one of the wire or TAB bonds is determined to be faulty after such connections have been made, that pad can be electrically isolated by severing the corresponding connecting strip 20, for example either by transversely cutting that strip or by scraping it away; whereupon the faulty bond can be cut or pulled away from the bonding pad, or, in some cases, can simply be left in place and bypassed if no short circuiting has occurred between the bonding pad and the epitaxial layer. If the pad has been short-circuited to the epitaxial layer and remains so after the wire or TAB conductor has been cut or pulled free, this is of no consequence because the bonding pad is now disconnected from the control circuitry and is electrically isolated from the test pad. Similarly, if the bonding pad is torn away from the mask layer, this cannot affect the integrity of the corresponding test pad. In any event, the faulty bond can then be repaired by bonding one end of repair wire or the like to the test pad, by conventional wire bonding means, and by connecting the other end of the wire to the corresponding pad by the control circuit. The control circuit may be provided with similar testing and bonding pad arrangement to simplify that operation, i.e. to provide a previously unused pad to which the repair wire can be attached.

Figure 3:
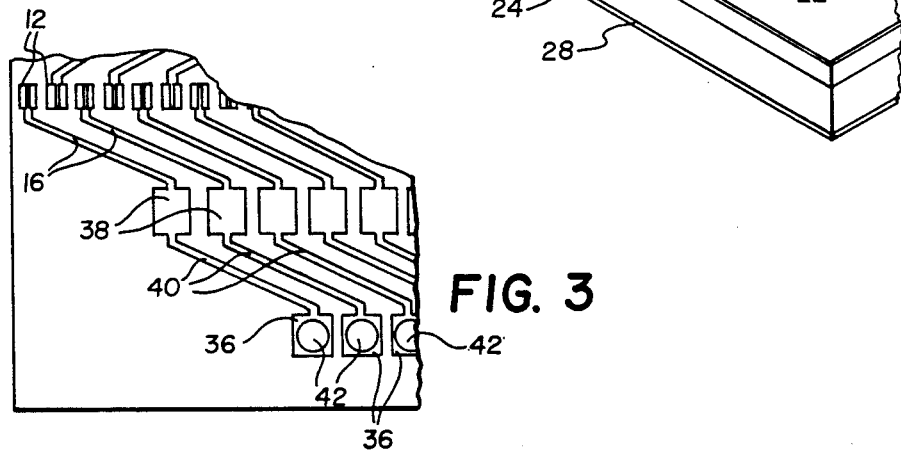
FIG. 3 is a fragmentary plan view of a chip similar to the one shown in FIGS. 1 and 2 but employing an alternate test and bonding pad arrangement.

The embodiment of the invention shown in FIG. 3 is the same as that described above except that, in this case, the bonding pads 36 are spaced more closely together than are the test pads 38, and the connector strips 40 are "fanned out" to connect with the test pads. This arrangement is particularly suited for use with the technique disclosed in commonly owned U.S. patent application Ser. No. 228,641, entitled LED ARRAY PRINTHEAD AND METHOD OF MAKING SAME, and filed on Aug. 5, 1988, in which TAB connector elements are bonded to both sides of an LED array chip before the latter is mounted to the support member of the printhead. By decreasing the length of the row of bonding pads, additional room is provided between the endmost bonding pads and the corresponding ends of the chip, to provide corresponding room for the edges of the TAB connector elements beyond the outermost conductors thereof. In general, TAB bonding technology allows the bonding pads to have a smaller pitch than is practicable for the corresponding test pads and this arrangement provides as much length as possible for the row of test pads while providing additional lateral space beyond the endmost bonding pads to accommodate the edges of the TAB elements.

Because the embodiment shown in FIG. 3 is specifically intended for use with a TAB connector, the bonding pads are shown with so-called "bumps" 42, which are commonly used in conjunction with that bonding system. Such "bumps", either on the chip pads or on the TAB element, are described in greater detail in an article entitled TAB Technology Tackles High Density Interconnections, in the Dec. 1984 edition of Electronic Packaging and Production, published by Cahners Publishing Company. Such bumps could also be provided on the bonding pads of the embodiment shown in FIGS. 1 and 2. Such use of bonding pad "bumps" also provides the additional advantages of making the chip useable with either TAB bonding or wire bonding, depending on whether the bond is made to the bonding pad or to the test pad.

We claim:

1. An electrically conductive electrode structure for selectively energizing a particular light emitting diode site of a light emitting diode array chip including a plurality of such sites, said structure comprising;
   a narrow electrode strip electrically connected at one end to a corresponding diode site;
   a test pad wider than said electrode strip and joined with the other end thereof;
   a bonding pad wider than said electrode strip and spaced from said test pad at the side thereof opposite said corresponding diode site; and
   a connecting strip narrower than either of said pads and joining said pads.

2. The electrode structure defined by claim 1 in which said test pad and said bonding pad are mutually aligned.

3. The electrode structure of claim 2 and wherein said bonding pad has a bump for use in tape-automated bonding.

4. The electrode structure defined by claim 1 in which said test pad and said bonding pad are offset relative to each other, said connecting strip extending diagonally between said pads.

5. A light emitting diode array comprising a generally rectangular chip provided with a central row of uniformly spaced light emitting diode sites and a corresponding plurality of mutually separated electrode structures extending alternately from opposite sides of said row, each of said electrode structures being electrically connected to a corresponding one of said diode sides, characterized in that each of said electrode structures comprises:

a narrow electrode strip electrically connected at one end to a corresponding diode site;

a test pad wider than said electrode strip and joined with the other end thereof;

a bonding pad wider than said electrode strip and spaced from said test pad at the side thereof opposite said corresponding diode site; and a connecting strip narrower than either of said pads and joining said pads.

6. The array defined by claim 5 in which said test pads and said bonding pads are uniformly spaced along corresponding rows parallel to said central row of light emitting diode sites, said bonding pads defining rows that are shorter than the rows defined by said test pads so that the endmost ones of said bonding pads are spaced further from the corresponding ends of said chip than the endmost ones of said test pads.

7. The array of claim 6 and wherein said connecting strip joining said pads is severable.

8. The array of claim 7 and wherein said bonding pads have bumps for use in tape-automated bonding.

9. The array of claim 8 and wherein said row defining test pads is shorter than said row of light emitting diode sites so that the endmost ones of said test pads are spaced further from the corresponding end of said chip than are the endmost ones of the row of light emitting diode sites.

10. The array of claim 6 and wherein said bonding pads have bumps for use in tape-automated bonding.

11. The array of claim 10 and wherein said row defining test pads is shorter than said row of light emitting diode sites so that the endmost ones of said test pads are spaced further from the corresponding end of said chip than are the endmost ones of the row of light emitting diode sites.

12. The array of claim 6 and wherein said row defining test pads is shorter than said row of light emitting diode sites so that the endmost ones of said test pads are spaced further from the corresponding end of said chip than are the endmost ones of the row of light emitting diode sites.

13. The electrode structure of claim 1 and wherein said bonding pads have bumps for use in tape-automated bonding.

* * * * *